(12) United States Patent
Nagamine et al.

(10) Patent No.: US 9,209,386 B2
(45) Date of Patent: Dec. 8, 2015

(54) MAGNETO-RESISTIVE ELEMENT HAVING A FERROMAGNETIC LAYER CONTAINING BORON

(71) Applicants: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR)

(72) Inventors: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR)

(*) Notice: Subject to any disclaimer, the term of this patent is extended or adjusted under 35 U.S.C. 154(b) by 0 days.

(21) Appl. No.: 14/157,356

(22) Filed: Jan. 16, 2014

(65) Prior Publication Data
US 2015/0069542 A1 Mar. 12, 2015

Related U.S. Application Data

(60) Provisional application No. 61/874,896, filed on Sep. 6, 2013.

(51) Int. Cl.
*G11B 5/39* (2006.01)
*H01L 43/08* (2006.01)
*H01L 43/12* (2006.01)
*H01L 43/10* (2006.01)

(52) U.S. Cl.
CPC .............. *H01L 43/08* (2013.01); *G11B 5/3909* (2013.01); *H01L 43/10* (2013.01); *H01L 43/12* (2013.01)

(58) Field of Classification Search
CPC ............ G11B 5/33; G11B 5/332; G11B 5/39; G11B 5/3903; G11B 5/3906; G11B 5/3909; G11B 2005/3996
USPC .................. 360/324.1, 324.11, 324.12, 324.2
See application file for complete search history.

(56) References Cited

U.S. PATENT DOCUMENTS

| 6,879,472 B2* | 4/2005 | Saito et al. ............... 360/324.11 |
| 2006/0056115 A1* | 3/2006 | Djayaprawira et al. ..... 360/324.2 |
| 2011/0188157 A1* | 8/2011 | Zhao et al. .................... 360/313 |
| 2011/0227179 A1* | 9/2011 | Kitagawa et al. .............. 257/421 |
| 2013/0015539 A1* | 1/2013 | Choi ............................. 257/421 |
| 2013/0028013 A1 | 1/2013 | Ikeda et al. |
| 2014/0144873 A1* | 5/2014 | Yoshida et al. .................. 216/22 |
| 2014/0198564 A1* | 7/2014 | Guo .............................. 365/158 |
| 2015/0069543 A1* | 3/2015 | Nagamine et al. ............ 257/421 |

FOREIGN PATENT DOCUMENTS

WO  WO 2010/125641 A1  11/2010

OTHER PUBLICATIONS

Koji Tsunekawa, et al.: "Giant tunneling magnetoresistance effect in low-resistance (CoFeB/MgO(001)/CoFeB magnetic tunnel junctions for read-head applications", Applied Physics Letters 87, Aug. 8, 2005, pp. 072503-1-072503-3 (in English).

* cited by examiner

*Primary Examiner* — Jefferson Evans
(74) *Attorney, Agent, or Firm* — Holtz, Holtz, Goodman & Chick PC

(57) ABSTRACT

According to one embodiment, a magneto-resistive element includes a first ferromagnetic layer formed on a substrate, a tunnel barrier layer formed on the first ferromagnetic layer, and a second ferromagnetic layer containing B formed on the tunnel barrier layer, the second magnetic layer containing therein any of He, Ne, Ar, Kr, Xe and $N_2$.

4 Claims, 5 Drawing Sheets

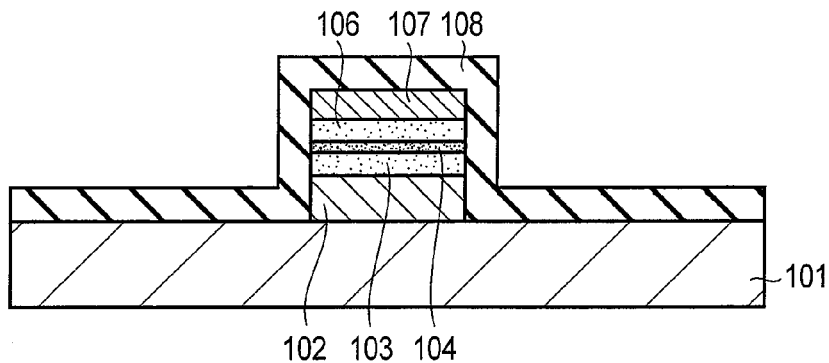
F I G. 4 E
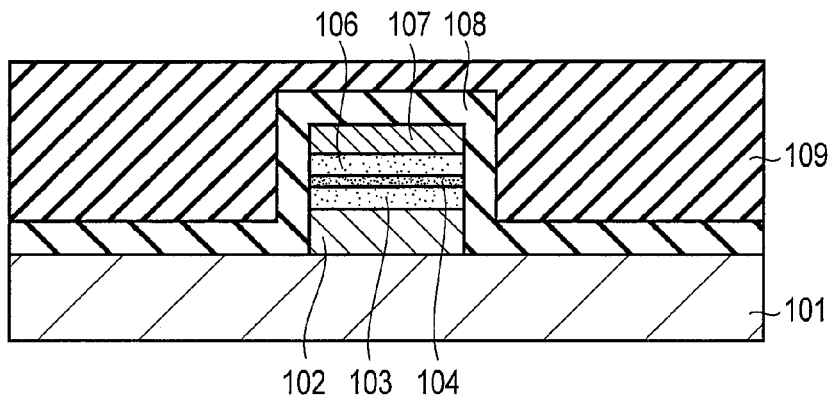
F I G. 4 F
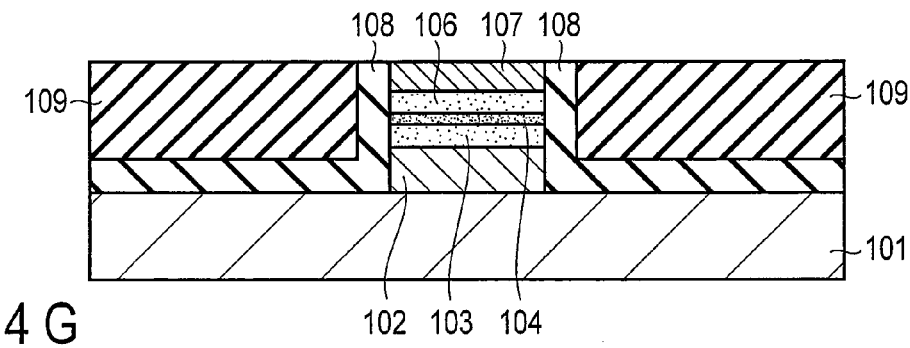
F I G. 4 G
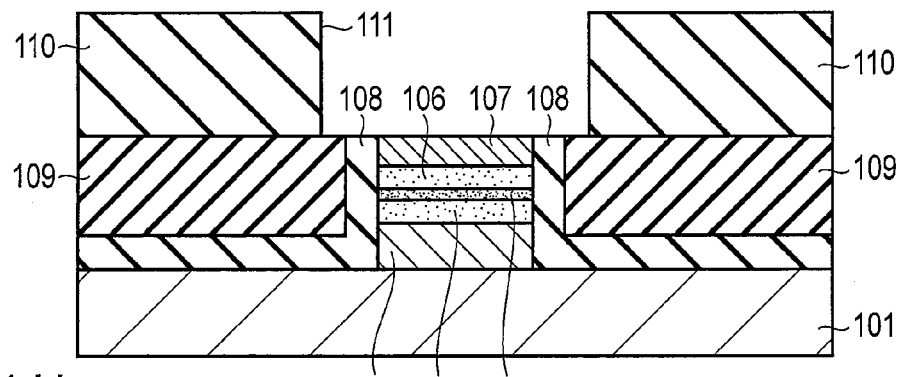
F I G. 4 H

US 9,209,386 B2

MAGNETO-RESISTIVE ELEMENT HAVING A FERROMAGNETIC LAYER CONTAINING BORON

CROSS-REFERENCE TO RELATED APPLICATIONS

This application claims the benefit of U.S. Provisional Application No. 61/874,896, filed Sep. 6, 2013, the entire contents of which are incorporated herein by reference.

FIELD

Embodiments described herein relate generally to a magneto-resistive element used in a magnetic random access memory, and a method of manufacturing the same.

BACKGROUND

Recently, large-capacity magneto-resistive random access memories (MRAMs) have been attracting attention, with expectations. An MRAM employs a magnetic tunnel junction (MTJ) element which exploits the tunnel magneto-resistive (TMR) effect. Each MTJ element in an MRAM comprises two ferromagnetic layers (CoFeB) between which a tunnel barrier layer (MgO) is interposed, one of the two ferromagnetic layers being a magnetization fixed layer (reference layer) in which the direction of magnetization is fixed and so does not change, and the other being a magnetization free layer (memory layer) the direction of magnetization of which is capable of being easily changed. The states in which the directions of magnetization of the reference layer and memory layer are mutually parallel and anti-parallel are respectively defined as binary 0 and binary 1 on the basis of which data can be stored.

More specifically, when the directions of magnetization of the reference and memory layers are parallel, the resistance of the tunnel barrier layer (that is, the barrier resistance) is low, and the tunnel current is greater than that when the directions of magnetization are antiparallel. The MR ratio is defined as: (resistance in antiparallel state−resistance in parallel state)/ resistance in parallel state. Because stored data is read by detecting differences in resistance due to the TMR effect, it is preferable when reading data that the ratio of resistive difference (MR ratio) by the TMR effect should be high.

BRIEF DESCRIPTION OF THE DRAWINGS

FIGS. 4A to 4H are cross sectional views of production steps of the magneto-resistive element shown in FIG. 3;

DETAILED DESCRIPTION

In general, according to one embodiment, there is provided a method of manufacturing a magneto-resistance element comprising: forming a first ferromagnetic layer on a substrate; forming a tunnel barrier layer on the first ferromagnetic layer; forming a second ferromagnetic layer containing B on the tunnel barrier layer; exposing a laminate of the first ferromagnetic layer, the tunnel barrier layer, and the second ferromagnetic layer to a compressed atmosphere; subjecting the laminate, exposed to the compressed atmosphere, to an anneal process, thereby promoting an orientation of the second ferromagnetic layer.

According to the conventional method of manufacturing an MTJ element, an MTJ film which exhibiting the TMR effect is formed on the surface of a substrate, and then the film is subjected to an anneal process. Immediately after the formation of the film, CoFeB is amorphous and MgO is crystalline. By the anneal process carried out after the formation of the film, CoFeB is crystallized and using MgO as a template, CoFeB—MgO—CoFeB having a (001) orientation is formed. Thus, a high MR ratio is exhibited.

It should be noted here that, with this method, however, the formation of (001) orientation is promoted, and therefore it becomes necessary to carry out the annealing even at a higher temperature. However, when the temperature is excessively high, the magnetic properties are degraded, and thus a high MR ratio cannot be achieved.

First Embodiment

Before explaining a specific embodiment, the basic concept of the first embodiment will now be described.

FIGS. 1A to 1D are schematic diagrams showing the processes according to the first embodiment and a comparative example.

Figure 1A:
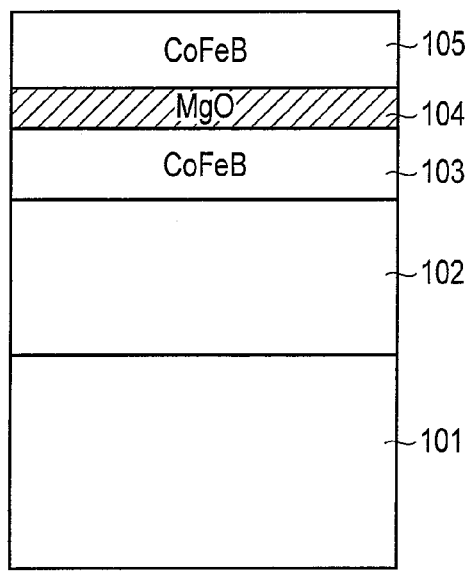
FIGS. 1A to 1D are schematic diagrams showing comparisons between the processes according to the first embodiment and a conventional process.

To manufacture a magneto-resistive element, a lower wiring layer 101 of Ta or the like, an underlying layer 102 of Ru or the like, a CoFeB (first ferromagnetic layer) 103, an MgO layer (tunnel barrier layer) 104 and another CoFeB layer (second ferromagnetic layer) 105 are stacked in this order on an underlying substrate (not shown) as illustrated in FIG. 1A. Thus, an MTJ film is formed. At this point, the CoFeB layer 105 is in the amorphous state.

Figure 1B:
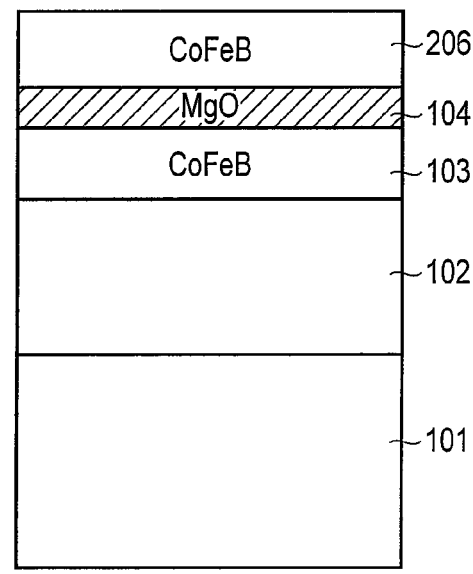

In the comparative example, after forming the MTJ film including the amorphous CoFeB layer 105, the film was annealed at 1 atmospheric pressure, and thus a (001)-oriented CoFeB layer 206 was formed as shown in FIG. 1B.

Figure 1C:
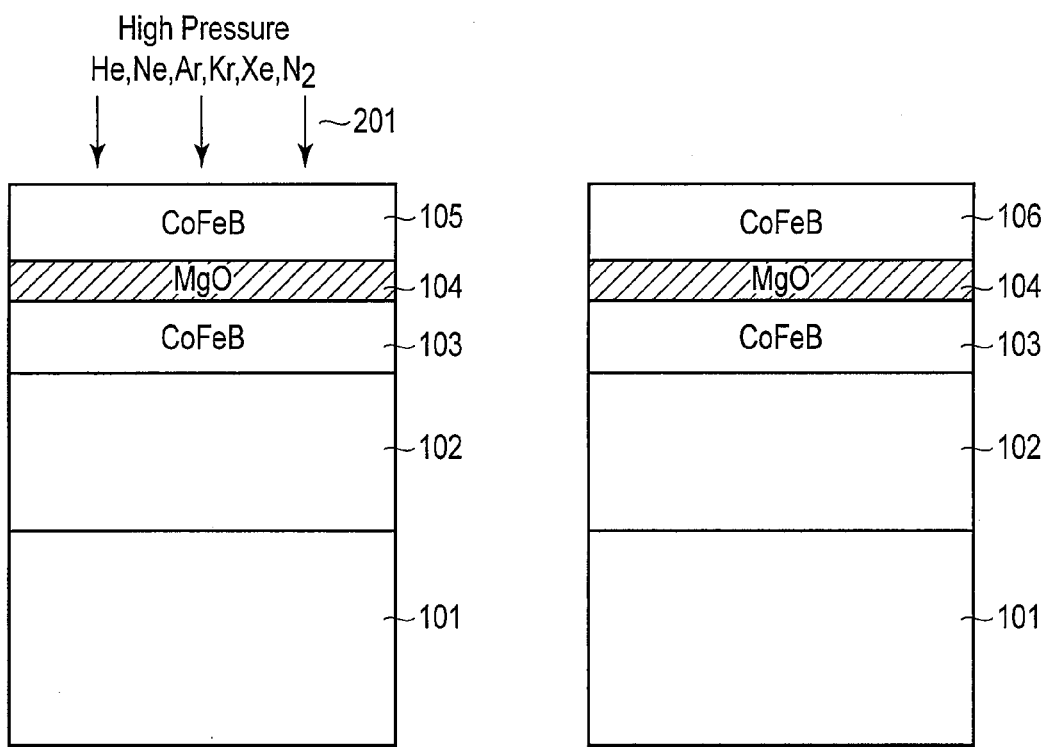
Figure 1D:
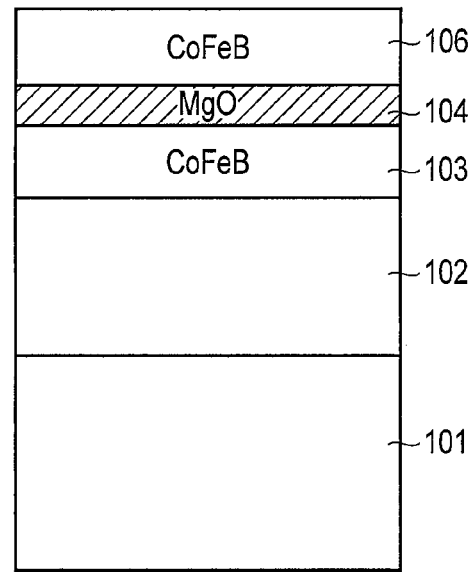

By contrast, according to this embodiment, an inert gas of He or the like is applied at a high pressure of 100 MPa or higher onto a surface of the amorphous CoFeB layer 105 as shown in FIG. 1C, so as to promote the (001) orientation of CoFeB using MgO as the template. The effect of the high-pressure process will be explained later in connection with FIG. 2. Subsequently, the film is annealed, and thus a (001)-oriented CoFeB layer was formed as shown in FIG. 1D.

Figure 2:
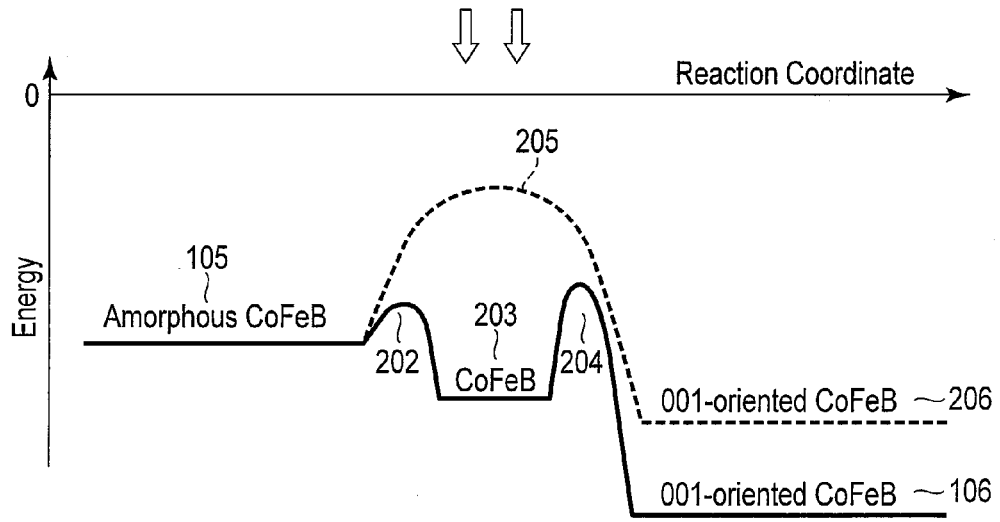
FIG. 2 is a schematic diagram illustrating the operation of the first embodiment.

FIG. 2 is a schematic diagram illustrating the operation of this embodiment. With the conventional method, an MTJ film containing an amorphous CoFeB layer 105 is formed, and then annealed. Thus, a CoFeB layer 206 is formed, which is (001)-oriented by a reaction path 205. But, the CoFeB layer 206 is not sufficiently oriented or the energy thereof is not very much lowered.

By contrast, when the CoFeB layer 105 is subjected to a high-pressure process according to this embodiment, a CoFeB layer 202 is formed, in which the (001) orientation has slightly progressed since the reaction is allowed to pass through a reaction path 202 due to the energy of the high-pressure process. Further, with the annealing carried out after the formation of the MTJ film, the reaction is allowed to pass through a reaction path 204, in which a CoFeB layer 106 with a (001) orientation more promoted than the conventional cases (or promoted crystallization) is formed. Thus a higher MR ratio can be realized.

In more detail, according to the conventional method, the (001)-oriented CoFeB layer 206 is formed by the annealing process carried out at 400° C. so as not to cause degradation of the magnetic properties. On the other hand, according to this embodiment, the (001)-oriented CoFeB layer 106 is formed by the annealing process at 400° C. carried out after treating the layer in a high pressure atmosphere of 100 MPa of He. With the conventional method, it is possible to form a CoFeB layer 106 oriented as in the case of FIG. 1D if the annealing temperature is raised to about 500° C.; however the high temperature causes degradation of the magnetic properties in this case.

It should be noted here that as shown in FIG. 2, an energy level of the CoFeB layer 106 of this embodiment is lower than that of the conventional CoFeB layer 206, and the reason why will now be described. That is, when CoFeB is compressed, the gaps between Co and Fe atoms are lessened, thereby making it easier to crystallize. When the annealing is carried out in this state, the crystallization of Co and Fe is promoted more as compared to the case of the annealing without the compression. Here, when the crystallization proceeds, the elements of Co and Fe settle at even more stable positions, and thus the energy level of the reaction system as a whole is lowered.

Further, the high-pressure process with an inert gas is correspondingly as effective as the increasing the anneal temperature equivalently. Therefore, this embodiment exhibits the same effect as that of the case where the high-pressure process is carried out at an equivalently higher anneal temperature while retaining the actual anneal temperature at 400° C. Thus, the magnetic properties thereof are not degraded.

The relationship between the pressure in the process and the annealing is as follows.

For example, the energy of a temperature of 400° C. with respect to room temperature 22 per atom is expressed as:

$$kT=1.38\times10^{-23}\times(400-22)=4.51\times10^{-21} J(=0.028\ eV)$$

on the other hand, as a model of the (001)-oriented CoFeB, let us now consider a bcc structure of Fe. Here, the volume occupied by one Fe atom of the bcc structure is expressed as:

$$\tfrac{1}{2}\times(2.86\ A)^3=1.17\times10^{-29}\ m^3$$

since the lattice constant is 2.86 A and the number of Fe atoms per unit lattice is 2. Therefore, the energy applied to one atom in the annealing at 400° C. can be converted into the pressure per unit volume as follows.

$$4.51\times10^{-21}/(1.17\times10^{-29})=3.81\times10^{8}\text{xm}^{-1}\ kg\cdot s^{-2}=381\ MPa$$

In the meantime, the phase transition enthalpy is expressed as follows.

$$Fe:1.0 kJ/mol=0.010\ eV(\alpha\to\gamma),\ 0.83 kJ/mol=0.009\ eV(\gamma\to\delta)$$

$$Co:0.43 kJ/mol=0.004\ eV$$

All of the above are in the same order as the energy per atom in the annealing at 400° C.

Here, the energy at 400° C. (that is, room temperature+ 378° C.) is equivalent to 381 MPa, and therefore a pressure of 100 MPa is equivalent to the energy of about 100° C. Therefore, the annealing at 400° C. together with the high-pressure process at 100 MPa is substantially equivalent to an annealing at 500° C.

When an annealing at 500° C. is carried out, a good orientation can be obtained, but the magnetic properties are deteriorated. By contrast, when the film is treated by the annealing at 400° C. after processed at a high pressure of 100 MPa, the same orientation as in the case of the annealing at 500° C. can be obtained. Further, the magnetic properties are maintained as well without being degraded since the temperature itself is within such a range which does not cause the degradation of the magnetic properties.

As described above, according to this embodiment, the high-pressure process with an inert gas is carried out, and thus it is possible to obtain, without causing the degradation of the magnetic properties, an equivalent effect to that of case where the anneal temperature is substantially raised. Thus, a CoFeB layer 106 with a further promoted (001) orientation than the conventional case can be formed, thereby making it possible to achieve a high MR ratio.

It should be noted that the inert gas is not limited to He, but a similar effect was obtained even with Ne, Ar, Kr, Xe or N.

Further, the pressure of the inert gas is not necessarily limited to 100 MPa or higher, but a significant difference cannot be observed unless the gas pressure is high to a certain degree. When the pressure of the inert gas is 10 MPa or higher, the effect of improving the orientation properties can be recognized, and when 100 MPa or higher, a sufficient effect can be obtained. Therefore, in order to improve the orientation properties, it suffices if the process is carried out in a pressurized atmosphere of an inert gas, and more preferably, at a pressure of 100 MPa or higher.

Next, a specific structure of a magneto-resistive element and a method of manufacturing the element according to the present embodiment will now be described.

Figure 3:
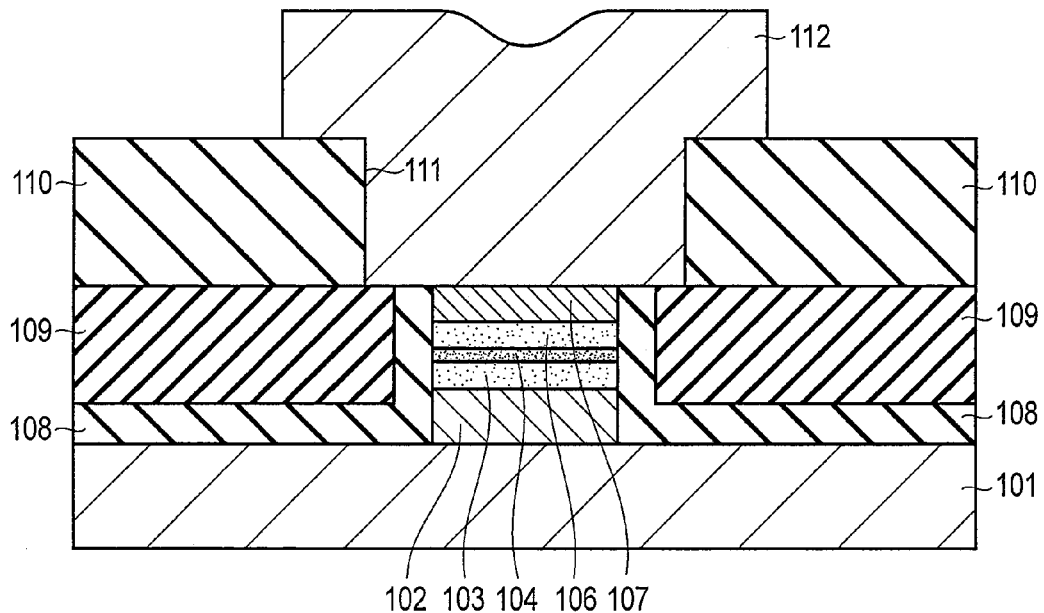
FIG. 3 is a cross sectional view schematically showing the structure of a magneto-resistive element according to the first embodiment.

FIG. 3 is a cross section of a brief structure of a magneto-resistive element of this embodiment. This element is an MTJ element used in an MRAM.

A lower wiring layer 101 of Ta or the like is formed on a substrate (not shown), and an underlying layer 102 of Ru or the like, a first ferromagnetic layer 103 comprising CoFeB, a tunnel barrier layer 104 comprising MgO, a second ferromagnetic layer 106 comprising CoFeB, and an upper wiring layer 107 of Al or the like are stacked on the lower wiring layer 101. These stacked layer structural components are processed to an island.

Here, due to the above-mentioned high-pressure processing using the inert gas, the concentration of B in the second ferromagnetic layer 106 is decreased. Further, the concentration of the molecules of the high-pressure gas in the second ferromagnetic layer 106 is 1% or more at a central portion thereof in its depth direction, whereas the concentration in an upper surface portion of the second ferromagnetic layer 106 is less than 1%. Note that "%" used in this specification is meant, in a strict sense, "atomic %", but for simplification, it is written merely as "%".

An insulation layer 108 of SiN or the like is formed on side surfaces of the MTJ portion processed into the island shape and also on the underlying wiring layer 101 in order to protect the MTJ portion. Further, an insulation layer 109 of $SiO_2$ or the like is embedded to be formed on the side surfaces of the MTJ portion such as to interpose the insulation layer 108 between each side surface and itself, as it is embedded therein.

An insulation layer 110 of $SiO_2$ or the like is formed on the insulation layer 109 and the MTJ portion, and a contact hole 111 is formed in the insulation layer 110 to open a section above the MTJ portion. Then, an upper wiring layer 112 of Al or the like is formed on the insulation layer 110 to fill in the contact hole 11, and the upper wiring layer 112 is processed into a wiring pattern.

It should be noted here that although it is not shown in the figure, the magneto-resistive element of this embodiment has a configuration in which the element is disposed at each intersection of bit lines BL and word lines WL arranged to intersect with each other, and each element is configured to function as a memory cell of MRAM.

Next, a method of manufacturing a magneto-resistive element of the present embodiment will now be described with reference to FIGS. 4A to 4H.

Figure 4A:
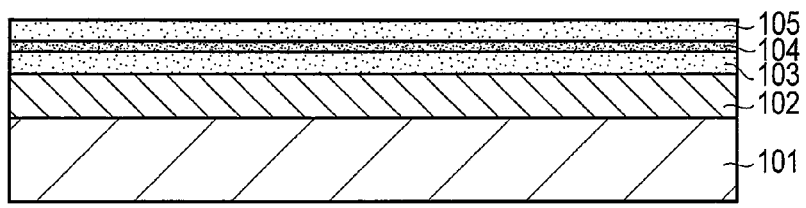

First, as shown in FIG. 4A, on a lower wiring layer 101 of Ta or the like having a thickness of 5 nm, formed are an underlying layer 102 of Ru or the like having a thickness of 2 nm, a CoFeB layer (first ferromagnetic layer) 103 having a thickness of 1.5 nm, an MgO (tunnel barrier layer) 104 having a thickness of 1 nm, and a CoFeB (second ferromagnetic layer) 106 having a thickness of 1.5 nm. The underlying layer 102 may also function as a reference layer. The first ferromagnetic layer 103 may be used as a reference layer or memory layer.

The method of forming the tunnel barrier layer 104 may be any of the followings: direct sputtering of the target of oxidation by RF; post-oxidation of a metal layer by oxygen gas, oxygen plasma, oxygen radical or ozone, a molecular beam epitaxy (MBE) method, an atomic layer deposition (ALD) method, an molecular beam epitaxy (MBE) and a chemical vapor deposition (CVD), etc. Further, the method of forming the ferromagnetic layers 103 and 105 may be any of the sputtering, MBE and ALD methods.

Figure 4B:
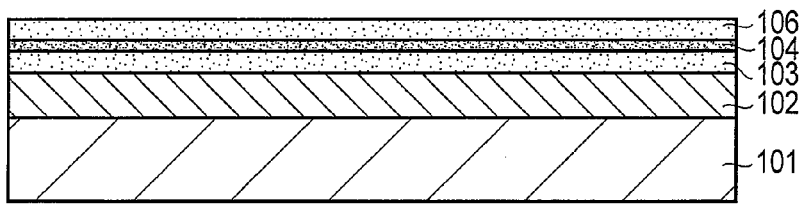

Next, the high-pressure gas process with the inert gas of this embodiment is applied, and thus, as shown in FIG. 4B, the CoFeB (second ferromagnetic layer) 106, whose (001) orientation is further promoted by that of the CoFeB 105, is formed. Note that the CoFeB 106 may be used as a memory layer or a reference layer.

More specifically, a He gas introduced to a container which contain a substrate having the structure shown in FIG. 4A, to treat the substrate in an inert gas atmosphere at about 100 MPa for about 5 minutes. Then, the He gas is discharged to render the inside of the container at atmospheric pressure or reduced pressure. While maintaining this state, the substrate is subjected to the anneal process at a temperature of about 400° C., and thus the CoFeB 106 with a promoted (001) orientation is formed. Thus, the substrate is processed by a high-pressure atmosphere of He gas while the entire surface of the CoFeB layer 105 is being exposed, and therefore B can be released at a high efficiency. Thus, a high MR ratio can be realized.

Figure 4C:
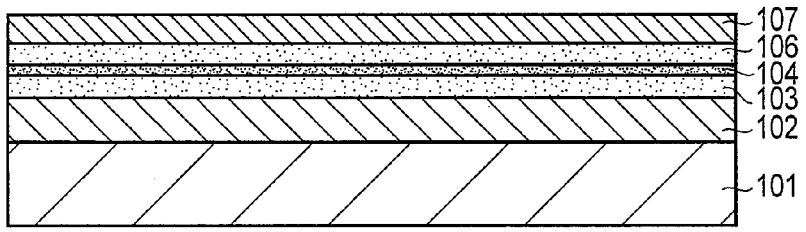

Next, as shown in FIG. 4C, the upper layer 107 of Ta or the like is formed on the CoFeB layer 106. The upper layer 107 may be used as an etching mask, a reference layer, a surface protection layer or an upper wiring connection layer. It should be noted that the timing of the annealing process for the crystallization of CoFeB is not necessarily limited to immediately after the formation of the CoFeB layer 106, but the process may be carried out after the formation of the upper layer 107.

Figure 4D:
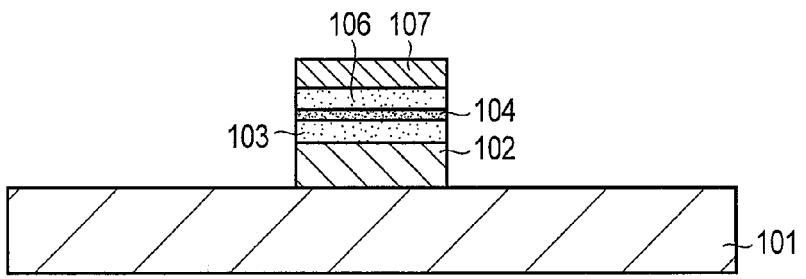

Next, as shown in FIG. 4D, the upper layer 107, the second ferromagnetic layer 106, the tunnel barrier layer 105, the first ferromagnetic layer 103 and the underlying layer 102 are etched selectively in this order by, for example, the ion milling method, and thus the stacked structure portion comprising the underlying layer 102 to the upper layer 107 is processed into an island shape.

Subsequently, as shown in FIG. 4E, the insulation layer 108 configured to protect the MTJ section in the next step is formed by, for example, the sputtering method, CVD method or ALD method. The insulation layer 108 is formed of, for example, SiN, SiOx, MgO and AlOx, on an upper surface and side surfaces of the MTJ portion and an exposed upper surface of the lower wiring layer 101.

Next, the lower wiring layer 101 is selectively etched by, for example, the reactive ion etching (RIE) method. Note that the processed section of the lower wiring layer 101 is located on, for example, the front side and further side of the page on FIG. 4E, and not shown. During the etching, the MTJ is protected by the insulation layer 108 shown in FIG. 4E.

Next, as shown in FIG. 4F, the insulation layer 109 is formed on the insulation layer 108 such as to bury the MTJ portion by, for example, the sputtering method or CVD method. The insulation layer 109 is formed of, for example, SiOx.

Next, as shown in FIG. 4G, the insulation layer 109 is subjected to etchback by, for example, the chemical mechanical polishing (CMP) method or gas phase etching method, and thus an upper surface of the upper layer 107 of the MTJ portion is exposed.

Next, as shown in FIG. 4H, the insulation layer 110 is formed on the MTJ portion and the insulation layer 109, and thereafter, the contact hole 111 is formed in the upper section of the MTJ portion by, for example, the RIE method. The insulation layer 110 is formed of, for example, SiOx.

From this stage on, the upper wiring layer 112 made of Al, Al—Cu or the like, is formed and then selectively etched into a wiring pattern by, for example, the RIE method, and thus a magneto-resistive element having the structure shown in FIG. 3 is completed.

Figure 5:
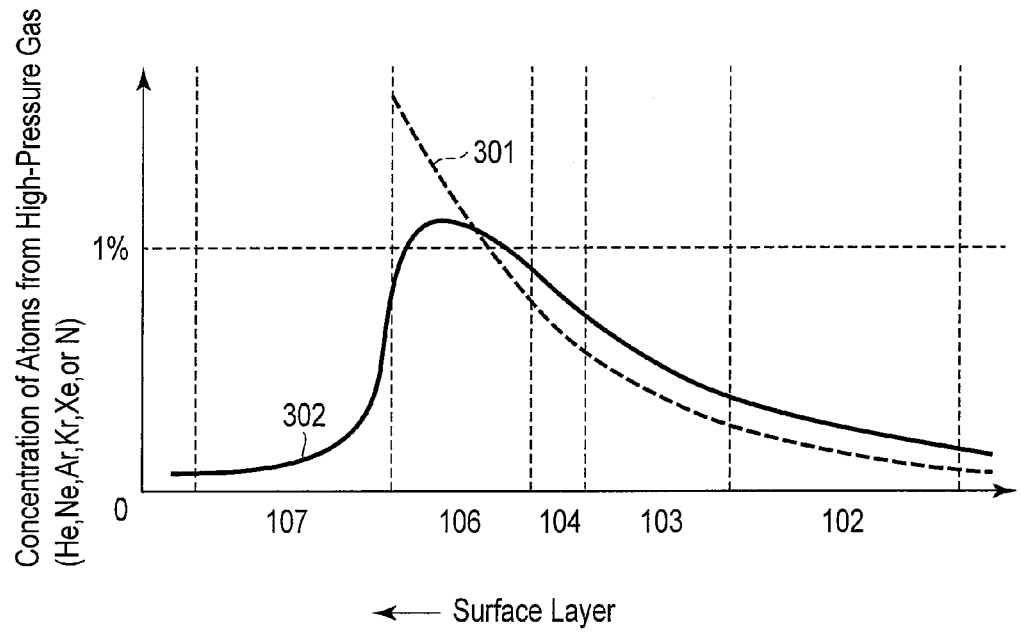
FIG. 5 is a diagram showing the concentration distribution of an inactive element in the magneto-resistive element manufactured by the first embodiment.

FIG. 5 is a diagram showing the distribution of the concentration of the atoms of the high pressure gas in the magneto-resistive element formed by this embodiment. Immediately after the high-pressure gas process, the concentration is at maximum on the outer most surface portion of the ferromagnetic layer 106 and the concentration decreases as recedes further from the surface, as indicated by a curve 301. On the other hand, when the upper layer 107 is formed and the device production process is completed, the atoms of the high-pressure gas diffuse above from the ferromagnetic layer 106, to have a distribution indicated by a curve 302.

As to the magneto-resistive element manufactured by this embodiment, about 1% or more of the atoms of the high-pressure gas remain in the second ferromagnetic layer 106. It is considered here that these atoms remain in gaps between the atoms of the second ferromagnetic layer 106 to expand the inter-atomic distance between atoms which exhibit ferromagnetic properties. In this manner, the volume as a magnetic layer enlarges while retaining its magnetic properties, and therefore the thermal stability $\Delta(=E/k_bT)$ of the magnetic layer is improved, thereby exhibiting the effect of suppressing abnormal reversal of magnetization.

For the above-described improvement of the thermal stability, it is preferable that the concentration of the remaining atoms of the high-pressure gas in the second ferromagnetic layer 106 be 1% or more. However, if there are an excessive number of atoms of the high-pressure gas, the degradation in the magnetic properties may be caused. In consideration of this, the concentration of the atoms of the high-pressure gas, which remain in the second ferromagnetic layer 106 should more preferably be 1% or more and within a range close to 1%. In other words, it should be 1% or more at a central portion of the ferromagnetic layer 106 in its depth direction, and less than 1% on the upper and lower surfaces thereof.

As described above, according to this embodiment, the CoFeB layer 105 as a ferromagnetic layer of the magneti-resistive element is formed, and then the CoFeB surface is treated with an inert gas in a high-pressure atmosphere at 100 MPa or higher. Thus, the (001) orientation of CoFeB can be promoted, and thus a high magneto-resistivity (MR) can be achieved. In particular, this embodiment has a great advantageous effect of achieving an excellent (001) orientation by the annealing even in the case of a CoFeB layer having a relatively small thickness of about 1.5 nm. Moreover, since the high-pressure gas component elements remain in the CoFeB layer 106, the volume of the layer as the magnetic layer is expanded while maintaining the magnetic properties of CoFeB, and the thermal stability of the magnetic layer can be improved. Thus, the abnormal reversal of magnetization can be suppressed.

To summarize, according to the conventional method of manufacturing a magneto-resistive element for MRAM, the MTJ film is formed and then subjected to annealing within such a temperature range that the gradation of magnetic properties does not progress. With this process, a sufficient (001) orientation cannot be obtained, thereby making it difficult to achieve a high MR ratio. By contrast, according to the present embodiment, the layer is subjected to a high-pressure process using an inert gas, and thus an excellent (001) orientation can be obtained even with annealing in such a temperature range that the gradation of magnetic properties does not progress, thereby making it possible to achieve a high MR ratio.

Therefore, according to the present embodiment, a magneto-resistive element with excellent properties can be realized as a memory device for MRAM, and the advantageous effect thereof is exceedingly high.

It should be noted here that in this embodiment, the annealing process is carried out after treating the object under a high-pressure atmosphere with an inert gas, but the relationship between these processes may be reversed. In other words, a similar effect can be obtained if the treatment of the high-pressure atmosphere with an inert gas is performed after the annealing at about 400° C.

Second Embodiment

In the first embodiment, the annealing is carried out after the treatment of the high-pressure atmosphere with an inert gas or the treatment of the high-pressure atmosphere with an inert gas is carried out after the annealing, but these processes may be performed simultaneously. In the second embodiment, the annealing is carried out within a high-pressure atmosphere of an inert gas.

Figure 6:
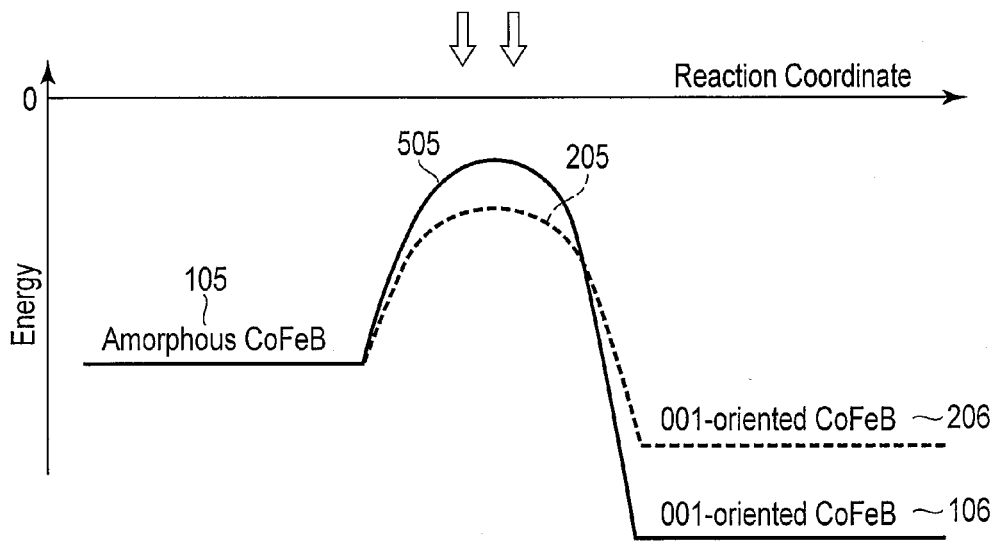
FIG. 6 is a schematic diagram illustrating the operation of the second embodiment.

FIG. 6 is an explanatory diagram illustrating a case where the high-pressure process and annealing are carried out simultaneously. In this embodiment, the pressure of the inert gas was set to 100 MPa and the annealing temperature was 400° C. As a comparative example, the annealing temperature in the case of the conventional method was 400° C.

As in the case shown in FIG. 2, according to the conventional method, an MTJ film including an amorphous CoFeB layer 105 is formed and then annealed, and thus a (001)-oriented CoFeB layer 206 is obtained by a reaction path 205.

In contrast, according to this embodiment, the layer is annealed under a high-pressure He atmosphere, but even at the same temperature of 400° C. as in the conventional case, the reaction is allowed to pass through a reaction path 505. Thus, a CoFeB layer 106 with a (001) orientation further promoted than that of the conventional case is formed, thereby making it possible to achieve a high MR ratio.

In this embodiment, the annealing process is carried out at 400° C. under a high-pressure atmosphere at 100 MPa, and thus the same orientation as in the case of the first embodiment explained above, where the annealing at 500° C. was carried out. Moreover, the temperature of this embodiment is within such a range that does not cause the degradation of magnetic properties. Thus, the same advantageous effect as that of the first embodiment can be obtained without causing the degradation of magnetic properties.

Modified Example

Note that the embodiments are not limited to those explained above.

In the embodiments explained above, the pressurized process and annealing are carried out before the processing o the MTJ film, but the pressurized process and annealing may be carried out after the processing of the MTJ film. Further, it is possible that the pressurization is carried out before the processing, whereas the annealing is after the processing.

The inert gas used in the high-pressure gas process in these embodiments is not limited to He, but it suffices if the gas contain molecules of any of Ne, Ar, Kr, Xe and N.

The distribution of concentration of the high-pressure gas componential elements contained in the second ferromagnetic layer is not necessarily limited to about 1% or higher in the central portion, and less than 1% in the surface portion, but these limitation values may exceed unless not in great deal varied.

Further, the ferromagnetic layer is not limited to CoFeB, but it may be of any ferromagnetic member as long as it contains B. Furthermore, the tunnel barrier layer is not limited to MgO, but it is also possible to use, for example, AlN, AlON or $Al_2O_3$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magneto-resistive element comprising:
a first ferromagnetic layer formed on a substrate;
a tunnel barrier layer formed on the first ferromagnetic layer; and
a second ferromagnetic layer containing B formed on the tunnel barrier layer, the second magnetic layer containing therein any of He, Ne, Ar, Kr, Xe and $N_2$,
wherein a concentration of any of He, Ne, Ar, Kr, Xe and $N_2$ contained in the second ferromagnetic layer is higher in a central portion in a depth direction of the second ferromagnetic layer than the concentration in an upper portion of the second ferromagnetic layer.

2. The magneto-resistive element of claim 1, wherein the concentration of any of He, Ne, Ar Kr, Xe and $N_2$ contained in the second magnetic layer is 1% or higher in the central portion of the second magnetic layer in a depth direction thereof, and the concentration in an upper surface of the second magnetic layer is less than 1%.

3. The element of claim 1, wherein one of the first and second ferromagnetic layers is a magnetization fixed layer in which a direction of magnetization is fixed to be unchanged, the other of the first and second ferromagnetic layers is a magnetization free layer in which the direction of magnetization is easily reversible, and the magneto-resistive element is used as a memory cell of a magnetic random access memory.

4. The element of claim 1, wherein the second ferromagnetic layer contains Co, Fe and B.

* * * * *